(12) United States Patent
Cabral, Jr. et al.

(10) Patent No.: US 8,492,899 B2
(45) Date of Patent: Jul. 23, 2013

(54) METHOD TO ELECTRODEPOSIT NICKEL ON SILICON FOR FORMING CONTROLLABLE NICKEL SILICIDE

(75) Inventors: Cyril Cabral, Jr., Mahopac, NY (US); John M. Cotte, New Fairfield, CT (US); Kathryn C. Fisher, Brooklyn, NY (US); Laura L. Kosbar, Mohegan Lake, NY (US); Christian Lavoie, Pleasantville, NY (US); Zhu Liu, Kunming (CN); Xiaoyan Shao, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 12/904,597

(22) Filed: Oct. 14, 2010

(65) Prior Publication Data
US 2012/0091589 A1    Apr. 19, 2012

(51) Int. Cl.
*H01L 29/40* (2006.01)
*H01L 23/52* (2006.01)
*H01L 23/48* (2006.01)
*H01L 21/44* (2006.01)

(52) U.S. Cl.
USPC ............ 257/754; 257/E21.158; 257/E23.157; 438/655

(58) Field of Classification Search
None
See application file for complete search history.

(56) References Cited

U.S. PATENT DOCUMENTS

| | | | |
|---|---|---|---|
| 3,140,988 A | 7/1964 | Clauss et al. | |
| 4,359,487 A | 11/1982 | Schneider | |
| 5,512,502 A | 4/1996 | Ootsuka et al. | |
| 6,017,791 A | 1/2000 | Wang et al. | |
| 6,420,784 B2 | 7/2002 | Hu et al. | |
| 6,440,828 B1 | 8/2002 | Sato et al. | |
| 6,576,831 B2 | 6/2003 | Woditsch et al. | |
| 7,160,582 B2 | 1/2007 | Girard et al. | |
| 2004/0005468 A1 | 1/2004 | Steinecker | |
| 2007/0138580 A1 | 6/2007 | Takahashi et al. | |
| 2008/0160210 A1 | 7/2008 | Yang et al. | |
| 2008/0268636 A1 | 10/2008 | Yoon et al. | |
| 2009/0004850 A1 | 1/2009 | Ganguli et al. | |
| 2009/0014878 A1 * | 1/2009 | Cabral, Jr. et al. ............ 257/751 |
| 2009/0104432 A1 | 4/2009 | Gazda | |
| 2011/0061729 A1 * | 3/2011 | Lee et al. ...................... 136/256 |
| 2011/0253545 A1 * | 10/2011 | Kosbar et al. ................... 205/91 |

FOREIGN PATENT DOCUMENTS
EP    0071436 A1    2/1983

* cited by examiner

*Primary Examiner* — Fernando L Toledo
*Assistant Examiner* — Valerie N Newton
(74) *Attorney, Agent, or Firm* — Novak Druce Connolly Bove + Quigg LLP; Louis J. Percello, Esq.

(57) ABSTRACT

The present disclosure relates to an improved method of providing a Ni silicide metal contact on a silicon surface by electrodepositing a Ni film on a silicon substrate. The improved method results in a controllable silicide formation wherein the silicide has a uniform thickness. The metal contacts may be incorporated in, for example, CMOS devices, MEM (micro-electro-mechanical) devices, and photovoltaic cells.

20 Claims, 12 Drawing Sheets

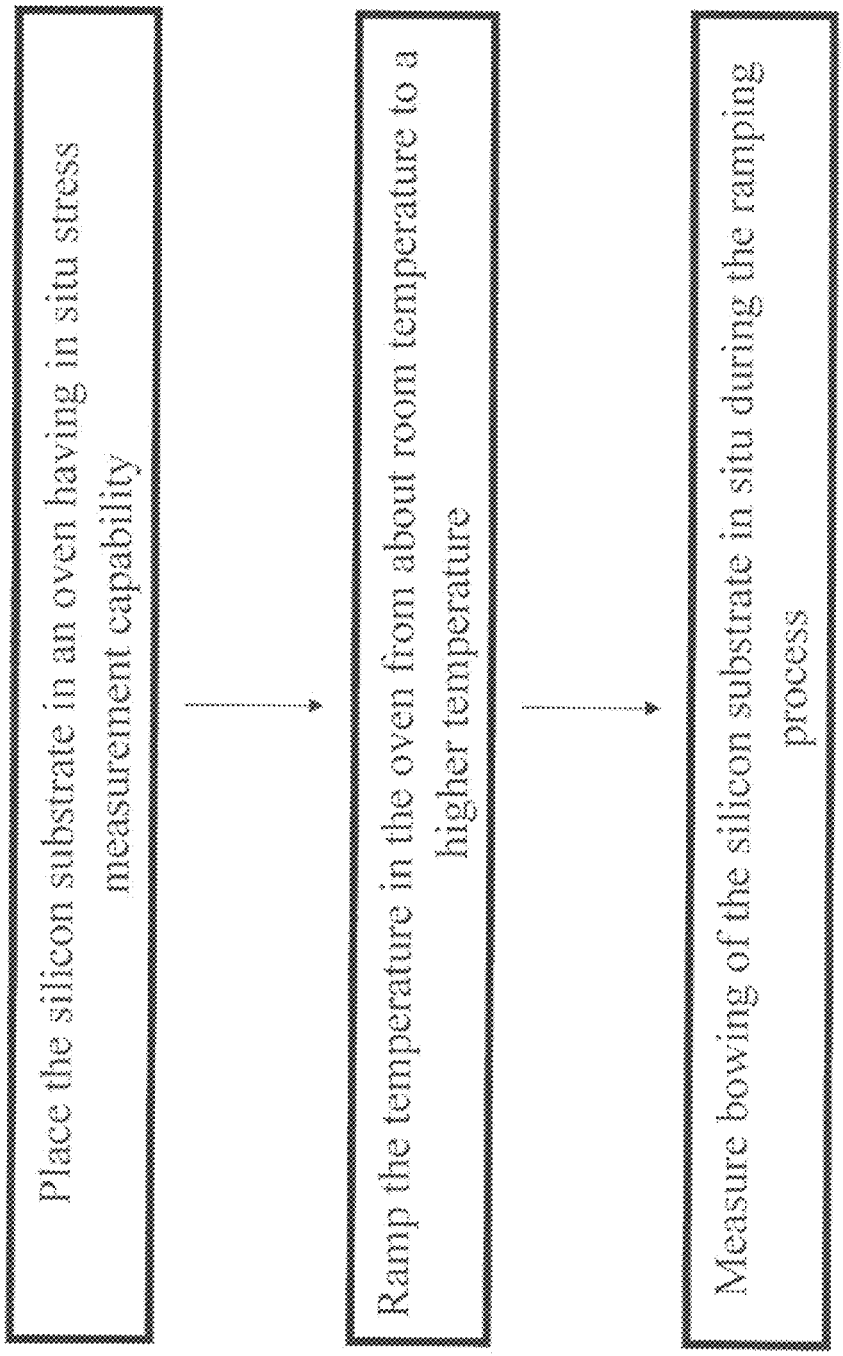

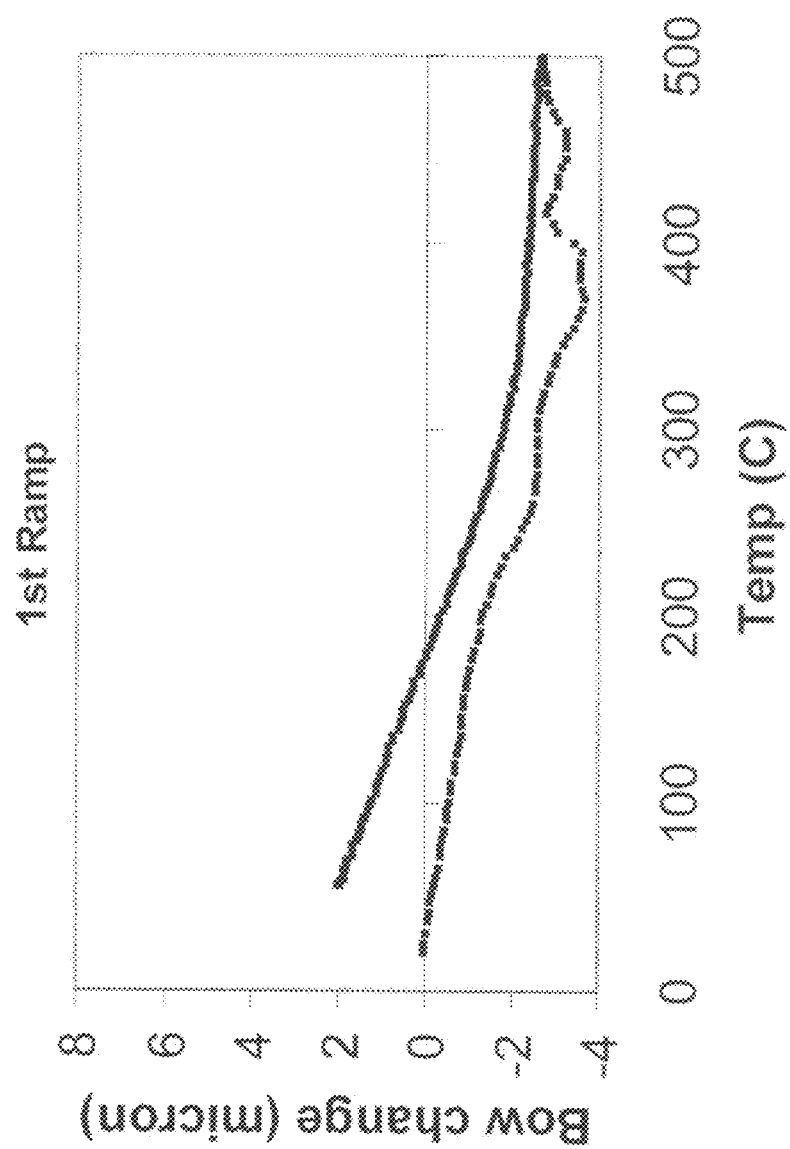

2nd Ramp

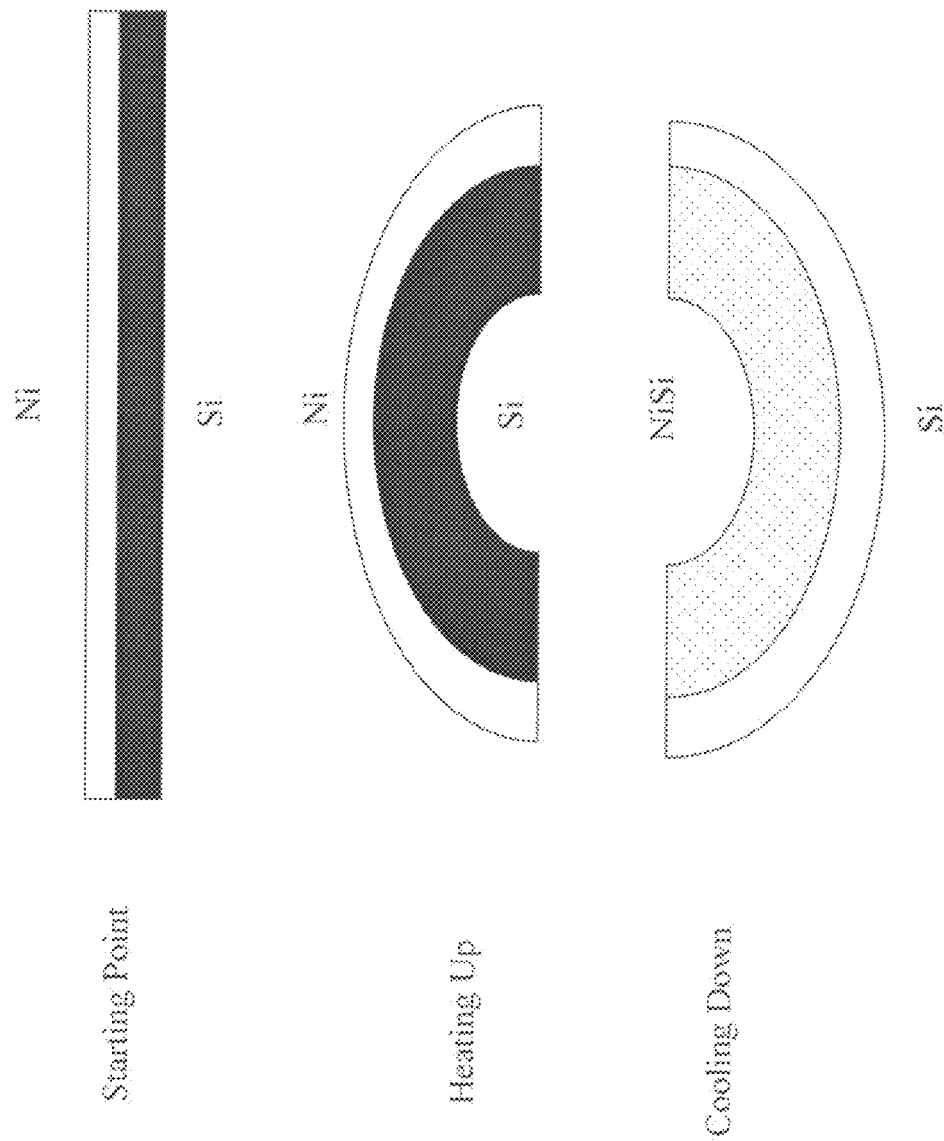

METHOD TO ELECTRODEPOSIT NICKEL ON SILICON FOR FORMING CONTROLLABLE NICKEL SILICIDE

TECHNICAL FIELD

The present disclosure relates to an improved method of providing a metallic contact on a silicon surface. The metal contacts may be incorporated in, for example. CMOS devices. MEM (micro-electro-mechanical) devices, and photovoltaic cells. The method comprises electrodepositing a Ni film on a silicon substrate to form a controllable silicide having a uniform thickness.

BACKGROUND OF THE DISCLOSURE

Ni or Co silicides are commonly used in CMOS technology to form metallic contacts with silicon. Typically, the Ni or Co layer is applied to the silicon substrate using high vacuum physical vapor deposition (PVD) processes such as sputtering or evaporation. While these processes are highly precise, the cost associated with them is prohibitive for several other applications that need silicide contact layers such as MEM devices, and silicon photovoltaic applications.

One alternative to high vacuum physical vapor deposition processes is to apply Ni or Co using solution processes, such as in electroless deposition or electrodeposition of Ni or Co. In this approach, however, it is difficult to control the silicide formation because the adhesion of metals deposited from solution processes on semiconductors is marginal. This is a problem because the delamination of metal films from the semiconductor surface prevents a uniform formation of silicide during thermal annealing. Traditionally, the annealing process in CMOS technology converts the whole metal layer deposited by PVD processes into silicide. Therefore, the silicide thickness is controlled by controlling the thickness of the metal layer deposited by PVD. In solution processes, however, it is very difficult to deposit a very thin, uniform layer of metal films on a semiconductor surface due to the low nucleation density of most of these methods. Therefore, to better control the silicide formation, a layer of Ni or Co from a solution-based process is deposited on silicon samples with sufficient thickness to ensure continuous metal coverage. The samples are then annealed to form a layer of silicide (while leaving unreacted Ni or Co metal on the surface). Unreacted Ni or Co is then removed by selective chemical etching to prevent delamination of the metal and the silicide. The added steps required to control the silicide formation in the solution-based processes complicate the device manufacturing.

SUMMARY OF THE DISCLOSURE

The present disclosure provides an electrodeposition process to deposit a metallic film layer on silicon. Typically, the metallic film is Ni, and is deposited from a saccharin-free plating bath comprising Ni sulfamate and boric acid. Surprisingly, the higher stress Ni films applied from plating baths of the instant disclosure exhibit better adhesion to the silicon substrate than lower stress films such as those formed using plating baths comprising Watts Ni with additives. The deposited Ni to Ni deposited from a physical vapor deposition (PVD) method in that it allows for a controlled silicide formation wherein the resulting silicide has a uniform thickness. The electrodeposition method of the instant disclosure allows for a controllable silicide formation at relatively low cost (as compared to physical vapor deposition methods).

One aspect of the present disclosure is a method of forming, a silicide, having a controllable, uniform thickness, on a silicon substrate comprising:
(A) electrodepositing a Ni film on a silicon substrate, wherein the Ni film is electrodeposited from a saccharin-free plating bath comprising Ni sulfamate and boric acid: and
(B) forming a metallic silicide pattern by annealing the Ni film on the silicon substrate.

Typically, the Ni film that is deposited has a thickness of about 20 nanometers to about 500 nanometers, and the metallic silicide pattern that is formed has a thickness of about 20 nanometers to about 1000 nanometers. More typically, the metallic silicide pattern that is formed has a thickness of about 30 nanometers to 100 nanometers. The thickness of the metallic silicide pattern maybe controlled by adjusting the annealing temperature and length of time the metallic film is annealed on the silicon substrate. Metallic films comprising Ni, Co, Pt, Pd, Ag, Au, or an alloy thereof may be utilized in this method. More typically, metallic films comprising Ni are used and are annealed on the silicon substrate at temperatures of about 250 degrees Celsius to about 400 degrees Celsius for about 5 seconds to about 600 seconds.

When Ni is electrodeposited from a saccharin-free plating bath comprising Ni sulfamate and boric acid, the plating bath is typically maintained at a pH of about 2 to about 5, and at a temperature of about 0 degrees Celsius to about 60 degrees Celsius. The concentration of Ni sulfamate in the plating bath is usually about 0.01 M to about 5 M. More typically, the concentration of Ni sulfamate is about 0.1 M to about 2 M. The silicides formed by this process can be utilized in, for example, CMOS devices, MEM devices, and photovoltaic cells.

In another aspect of the disclosure, the annealing step further comprises monitoring the formation of the metallic silicide pattern by:
(A) placing the silicon substrate in an oven having in situ stress measurement capability;
(B) ramping a temperature in the oven from about room temperature to a higher temperature; and
(C) measuring a bowing of the silicon substrate in situ during the ramping process.

Typically, the higher temperature is about 500 degrees Celsius, and the ramping of the temperature from about room temperature to about 500 degrees Celsius is performed at least two times.

Yet another aspect of the present disclosure is a method of forming a silicide, having a controllable, uniform thickness, on a silicon substrate comprising:
(A) texturing a front side of a doped silicon substrate;
(B) forming a diode junction by diffusing a dopant opposite to a dopant of the doped silicon substrate on the front side of the doped silicon substrate;
(C) depositing an anti-reflective coating on the front side of the silicon substrate;
(D) depositing a metallic layer on a back side of the silicon substrate and heating to form aback surface field;
(E) patterning a mask over the anti-reflection coating;
(F) etching out exposed regions of the anti-reflection coating;
(G) electrodepositing a Ni film on the etched regions of the front side of the silicon substrate, wherein the Ni film is electrodeposited from a saccharin-free plating bath comprising Ni sulfamate and boric acid;
(H) removing the mask;
(I) annealing the Ni film to farm a metallic silicide pattern on the front side of the silicon substrate; and (J) depositing a conductor layer on the metallic silicide pattern.

Typically, the Ni film is deposited on a phosphorous-doped silicon substrate, and the film has a thickness of about 20 nanometers to about 500 nanometers. The resulting metallic silicide pattern usually has a thickness of about 20 nanometers to about 1000 nanometers. More typically, the metallic silicide pattern that is formed has a thickness of about 30 nanometers to about 100 nanometers. Metallic films comprising Ni, Co, Pt, Pd, Ag, Au, or an alloy thereof may be utilized in this method. More typically, metallic films comprising Ni are used and are annealed on the silicon substrate at temperatures of about 250 degrees Celsius to about 400 degrees Celsius for about 5 seconds to about 600 seconds. The thickness of the metallic silicide pattern may be controlled by adjusting the annealing temperature and the length of time the metallic film is annealed on the silicon substrate. Most typically, metallic films comprising Ni are annealed to a phosphorous-doped silicon substrate at about 300 degrees Celsius for approximately 10 minutes. The resulting metallic silicide pattern usually has thickness of about 20 nanometers to about 100 nanometers.

Moreover, where the metallic film comprises Ni, the Ni is typically electrodeposited from a saccharin-free plating bath comprising Ni sulfamate and boric acid. The plating bath is typically maintained at a pH of about 2 to about 5, and at a temperature of about 0 degrees Celsius to about 60 degrees Celsius. The concentration of Ni sulfamate in the plating bath is about 0.01 M to about 5 M. More typically, the concentration of Ni sulfamate is about 0.1 M to about 2 M. The silicides formed by this process can be utilized in, for example, CMOS devices, MEM (micro-electro-mechanical) devices, and photovoltaic cells.

The conductor layer in the above process typically comprises Cu, Ag, Au, Ni, Al, Co, or an alloy thereof. This layer may be deposited by solder dipping, electroplating, electrodeposition, or any other well known methods in the art. The conductor layer is usually deposited using an electrodeposition method.

In another aspect of the disclosure, the annealing step of the method above further comprises monitoring the formation of the metallic silicide pattern by:
  (A) placing the silicon substrate in an oven having in situ stress measurement capability;
  (B) ramping a temperature in the oven from about room temperature to a higher temperature; and
  (C) measuring a bowing of the silicon substrate in situ during the ramping process.

Typically, the higher temperature is about 500 degrees Celsius, and the ramping of the temperature from about room, temperature to about 500 degrees Celsius is performed at least two times.

Silicides formed by the processes of the instant disclosure may be incorporated into any device requiring a metal contact to silicon including, but not limited to, CMOS devices. MEM (micro-electro-mechanical) devices, and photovoltaic cells.

BRIEF DESCRIPTION OF THE DRAWINGS

FIG. 3 illustrates an exemplary process of monitoring the formation of the controlled silicide during the annealing step of the process of FIG. 1 or FIG. 2b.

FIG. 4a is a graphical representation of in-situ stress measurements of a substrate having a thick Ni film (200 nanometers) deposited by evaporation in a high vacuum chamber over a top surface of silicon during the first of two times that the temperature was ramped from room temperature to 500 degrees Centigrade.

FIG. 7a shows that non-uniform silicide and delaminated Ni flakes were formed on a silicon surface of a sample after annealing at 500 degrees Celsius for 30 seconds when Ni was electrodeposited from a common Watts Ni bath comprising a saccharin additive. FIG. 7b shows that uniform silicide was formed and complete consumption of Ni occurred on the silicon surface of a sample after the sample was annealed at 500 degrees Celsius for 30 seconds when Ni was electrodeposited from a solution comprising Ni sulfamate and boric acid.

FIG. 8 is a pictorial representation (through a cross-sectional view) of the bowing of the substrate that occurs during the method of the present disclosure.

DESCRIPTION OF BEST AND VARIOUS EMBODIMENTS OF DISCLOSURE

Figure 1:
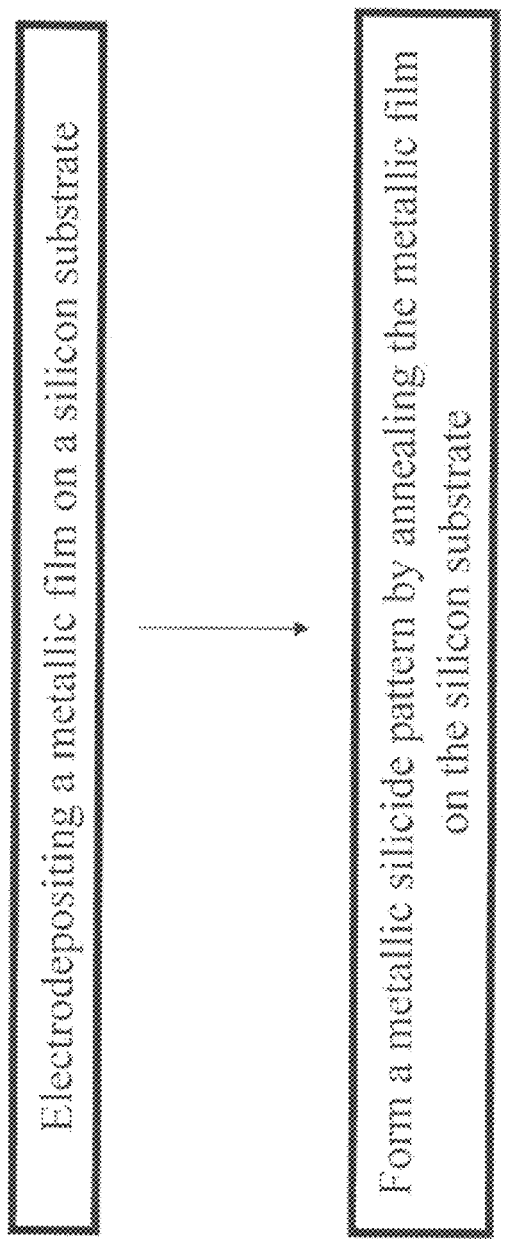
FIG. 1 illustrates an exemplary process of forming a controlled silicide of uniform thickness on a silicon substrate.

The present disclosure, which is directed to a method of forming a controlled silicide having a uniform thickness on a silicon substrate, and a CMOS device, micro-electro-mechanical (MEM) device, or a photovoltaic cell comprising a silicide formed by the method of the present disclosure, will now be described in greater detail by referring to the drawings that accompany the present application. It is noted that in the accompanying drawings, like reference numerals are used for describing like and/or corresponding elements.

FIG. 1 schematically illustrates the process flow of the present disclosure for forming a controlled silicide of uniform thickness on a silicon substrate. As shown, the process begins with the electrodeposition of a Ni film on a silicon substrate. Electrodeposition methods, such as the method of the present disclosure, are well known in the art but generally include immersing a portion of the silicon substrate in a plating bath comprising the metallic ions to be plated on the silicon substrate as well as supporting salts and additives. The pH of the plating bath is controlled depending on the nature of the metallic film to be plated as well as the other components of the solution. Depending on the ingredients, the solution may range from strongly acidic to strongly alkaline. A direct or pulsed electric current is then passed through the immersed portion of the substrate. The electric current is on for predetermined durations that are effective to electrodeposit the metallic film on the silicon substrate.

The metallic film of the present disclosure typically comprises Ni, Co, Pt, Pd, Ag, Au, or an alloy thereof and is deposited at a thickness of about 20 nanometers to about 500 nanometers on the silicon substrate. More typically, the metallic film is Ni and the plating bath, which is free of saccharin, comprises Ni sulfamate and boric acid, wherein the concentration of Ni sulfamate is about 0.01 M to about 5 M, and more typically about 0.1 M to about 2 M. The concentration of boric acid is usually about 15 to 40 grams/liter, and more typically is 15 to 35 grams/liter. The plating bath may also contain Cl— and $SO_4^{2-}$ ions. The Ni sulfamate plating bath is usually maintained at a pH of about 2 to about 5, and a temperature of about 0 degrees Celsius to about 60 degrees Celsius.

After electrodeposition is completed, the metallic film is annealed to form a metallic silicide pattern on the silicon substrate. Any annealing method known in the art may be used. For instance, a conventional annealing oven can be used if a thicker silicide (e.g., 200 nanometers ore more) is desired. More typically, rapid thermal annealing, laser annealing, or belt furnace annealing methods are used. Silicide formation may be controlled during these processes by, for example, varying the time and temperature at which the annealing occurs. Typically, the metallic films are annealed at a temperature of about 250 degrees Celsius to about 400 degrees Celsius for a time of about 5 seconds to about 600 seconds. The resulting silicides are about 20 nanometers to about 1000 nanometers thick, and more typically have thicknesses of about 30 nanometers to about 100 nanometers. The silicided silicon substrates of the instant disclosure may be employed in, for example, CMOS devices, MEM (micro-electro-mechanical) devices, or in photovoltaic cells.

Figure 2A:
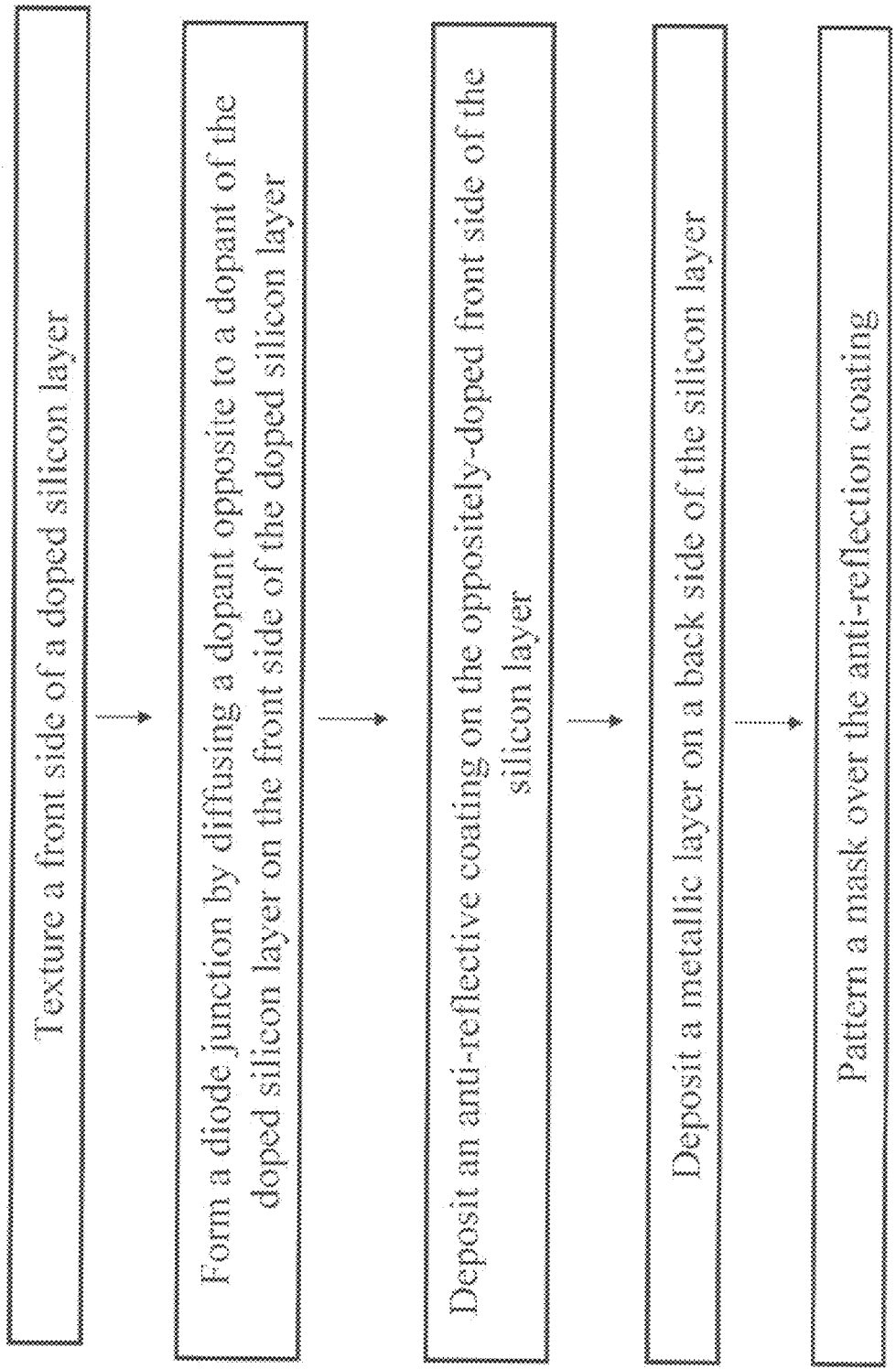
FIGS. 2a and 2b illustrate an exemplary process of forming a controlled silicide of uniform thickness on a silicon substrate that is particularly suitable for a photovoltaic cell.
Figure 2B:
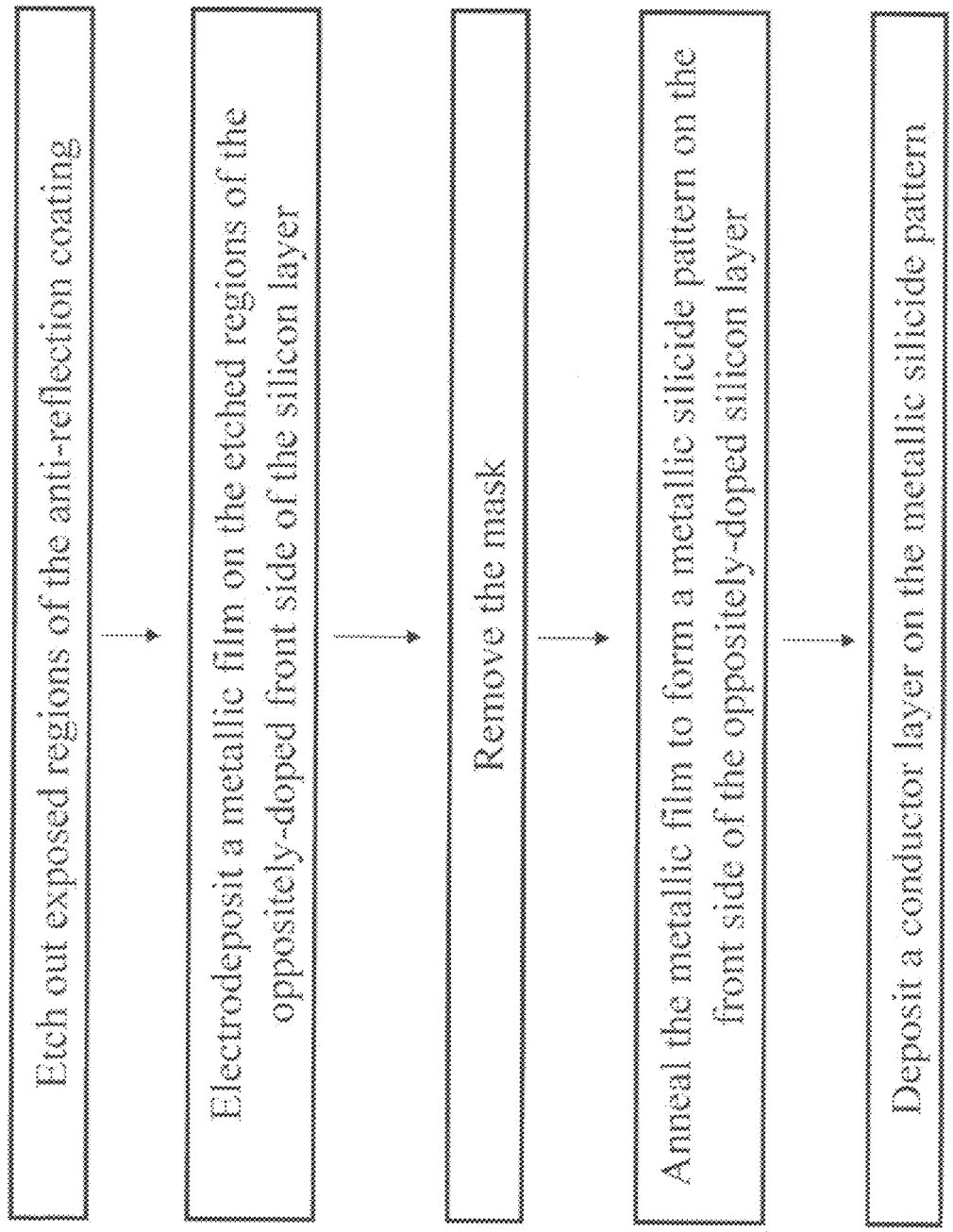

FIGS. 2a and 2h schematically illustrate a process flow of the present disclosure for forming a controlled silicide of uniform thickness on a silicon substrate wherein the resulting silicided substrate is particularly suitable for use in a silicon photovoltaic cell. To begin, a front side (or sun-facing side) of a doped silicon substrate is textured. Texturing is accomplished by chemical or physical abrasion to provide a radiation-capturing surface. The silicon is typically doped with elements such as boron or phosphorous to form p- or n-Si.

Next, a diode junction is formed by diffusing a dopant into the silicon substrate wherein the dopant being diffused is opposite to the dopant of the silicon substrate. For example, if the silicon substrate is doped with boron, then phosphorous may be diffused into the silicon substrate to form a diode junction.

After the diode junction is formed, an anti-reflective coating is deposited on the oppositely-doped front side of the silicon substrate. The anti-reflective coating typically comprises silicon nitride, tantalum oxide, silicon dioxide, titanium oxide, titanium dioxide, silicon dioxide, or magnesium fluoride having a thickness of about 20 nanometers to about 100 nanometers. As recognized in the art, the precise oxidation state of the anti-reflective layer may vary depending on the material used and its preparation conditions. Oxidation state variations, however, are compensated for by adjusting the thickness of the anti-reflective layer to provide the desired optical properties.

The anti-reflective coating is typically applied using plasma enhanced chemical vapor deposition or other techniques known in the art, such as atmospheric chemical vapor deposition (APCVD), thermal oxidation, screen printing of pastes, inks or sol gel, etc. Other techniques for depositing these materials may also be employed as are known in the art. The surface coating is applied so that it is disposed over the front surface and typically the edges of the substrate by placing the back surface of the substrate against a plate. The back surface of the substrate remains free of the surface coating.

Once the anti-reflective coating has been applied to the front side of the silicon substrate, a metallic layer is deposited on the back side of the silicon substrate. The substrate is then heated to form a back surface field (BSF). Al or Al-containing pastes or metallic layers are commonly used as the backside metal layer for BSF formation.

The anti-reflective coating is then masked to expose only the areas of the silicon substrate's surface that corresponds to a desired electrode pattern. Accordingly, an ink mask patterned onto the anti-reflective coating may be used, or a photoresist material that has been patterned by photolithographic means may be used to provide a masking layer that exposes regions of anti-reflective coating corresponding to the desired electrode pattern. The masked surface is then contacted with an etchant chosen to provide selective etching of the particular anti-reflective coating employed on the unmasked areas of the silicon substrate. The etching solution selectively etches the anti-reflective coating in preference to the underlying silicon substrate. Thus, the etching solution removes the unmasked regions of the anti-reflective layer that correspond to the desired electrode pattern, thereby exposing the underlying silicon substrate.

Next, a Ni film is electrodeposited on the etched regions of the front side of the silicon substrate (that is, the exposed regions of the silicon substrate). This is accomplished by immersing the exposed/etched regions of the silicon substrate in a plating bath comprising the Ni ions to be plated on the silicon substrate. The plating bath may also comprise supporting salts and additives. The pH of the plating bath is controlled depending on the nature of the metallic film to be plated, as well as the other components of the solution. Depending on the ingredients, the solution may range from strongly acidic to strongly alkaline. A direct or pulsed electric current is then passed through the immersed portion of the silicon substrate. The electric current is on for predetermined durations that are effective to electrodeposit the Ni film on the exposed silicon substrate.

The metallic film of the present disclosure typically comprises Ni, Co, Pt, Pd, Ag, Au, or an alloy thereof, and is deposited at a thickness of about 20 nanometers to about 500 nanometers on the silicon substrate. More typically, the plating bath, which is free of saccharin, comprises Ni sulfamate and boric acid, wherein the concentration of Ni sulfamate is about 0.01 M to about 5 M, and more typically about 0.1 M to about 2 M. The concentration of boric acid is usually about 15 grams/liter to about 40 grams/liter, and more typically about 20 grams/liter to about 35 grams/liter. The plating bath may also contain Cl— and $SO_4^{2-}$ ions. The Ni sulfamate plating bath is usually maintained at a pH of about 2 to about 5, and a temperature of about 0 degrees Celsius to about 60 degrees Celsius.

After electrodeposition is completed, the mask that was patterned over the anti-reflective coating is removed using a suitable solvent. The removal of the mask produces a photovoltaic cell having an anti-reflective coating and an interdispersed electrode. The electrodeposited metallic film is then annealed according to any method known in the art to form a metallic silicide pattern on the front side of the silicon substrate. A conventional annealing oven may be used if a thicker silicide (e.g., 200 nanometers ore more) is desired. More typically, rapid thermal annealing, laser annealing, or belt furnace annealing methods are used. Silicide formation may be controlled during these processes by, for example, varying the time and temperature at which the annealing occurs. Typically, the metallic films are annealed at a temperature of about 250 degrees Celsius to 400 degrees Celsius for a time of about 5 seconds to about 600 seconds. More typically, annealing is done at about 300 degrees Celsius for approximately 10 minutes. The resulting silicides are about 20 nanometers to about 1000 nanometers thick, and more typically have thicknesses of about 30 nanometers to 100 nanometers.

Lastly, a conductor layer is deposited on the metallic silicide pattern. This conductor layer is necessary because the metallic silicide pattern is insufficiently conductive to serve as a suitable current-carrying electrode for most solar cell applications. The conductor layer comprises a relatively high electroconductivity metal such as Ag, Au, Cu, Ni, Co, Al, Sn, or Zn, and may be formed by solder dipping, electroplating, electrodeposition, or other well known methods in the art. Most typically, the conductor layer is formed using an electrodeposition method.

Figure 4B:
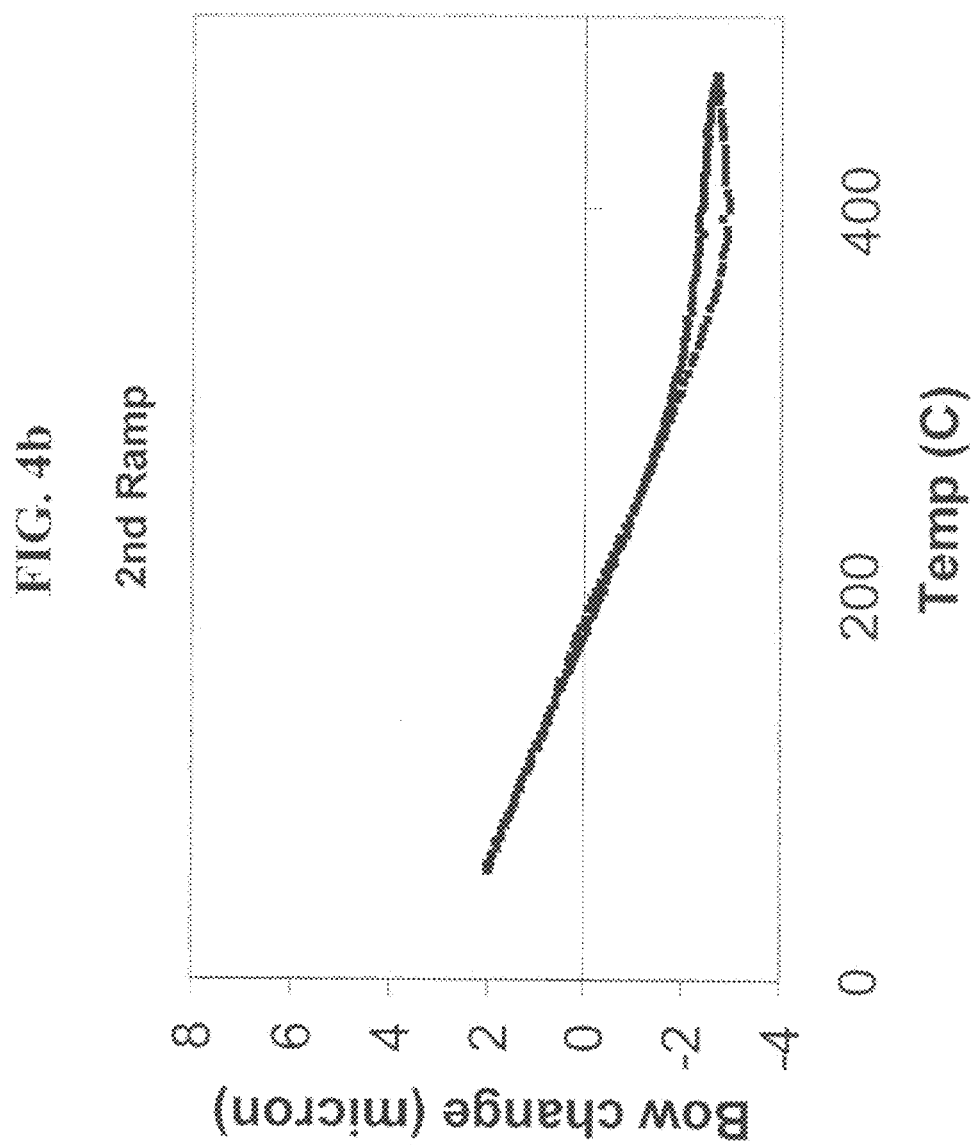
FIG. 4b is a graphical representation of in-situ stress measurements of a substrate having a thick Ni film (200 nanometers) deposited by evaporation in a high vacuum chamber over a top surface of silicon during the second of two times that the temperature was ramped from room temperature to 500 degrees Centigrade.

FIG. 3 schematically demonstrates a method of monitoring the silicide formation during the annealing step of any of the processes of the instant disclosure. To monitor the silicide formation, the silicon substrate is placed into an oven having in situ stress measurement capability alter electrodeposition of the metallic film has occurred. The oven temperature is then ramped from about room temperature to a higher temperature. The higher temperature is typically about 500 degrees Celsius, and the temperature is usually ramped from room temperature to about 500 degrees Celsius at least two times. Bowing of the silicon substrate in situ during the ramping process is then measured. The measurement is done by setting the initial state of the silicon substrate as zero bow change point. Subsequent heating then leads to negative bowing of an evaporated Ni film on silicon as demonstrated in FIG. 4a. The several peaks shown in FIG. 4a indicate the different silicide phase formation in the sample during the ramping process. After reaching the pre-set maximum annealing temperature of 500 degrees Celsius, the furnace begins cooling down. The cooling causes the bowing to change in a more positive direction due to a thermal mismatch of the formed silicide and the silicon substrate. FIG. 4b shows the sample of FIG. 4a during the second temperature ramp. Since no additional silicide formation occurs, the how change curve returns to its starting position during the second ramp. This aspect of the disclosure is further illustrated in the non-limiting examples which are described below.

COMPARATIVE EXAMPLE 1

Figure 6A:
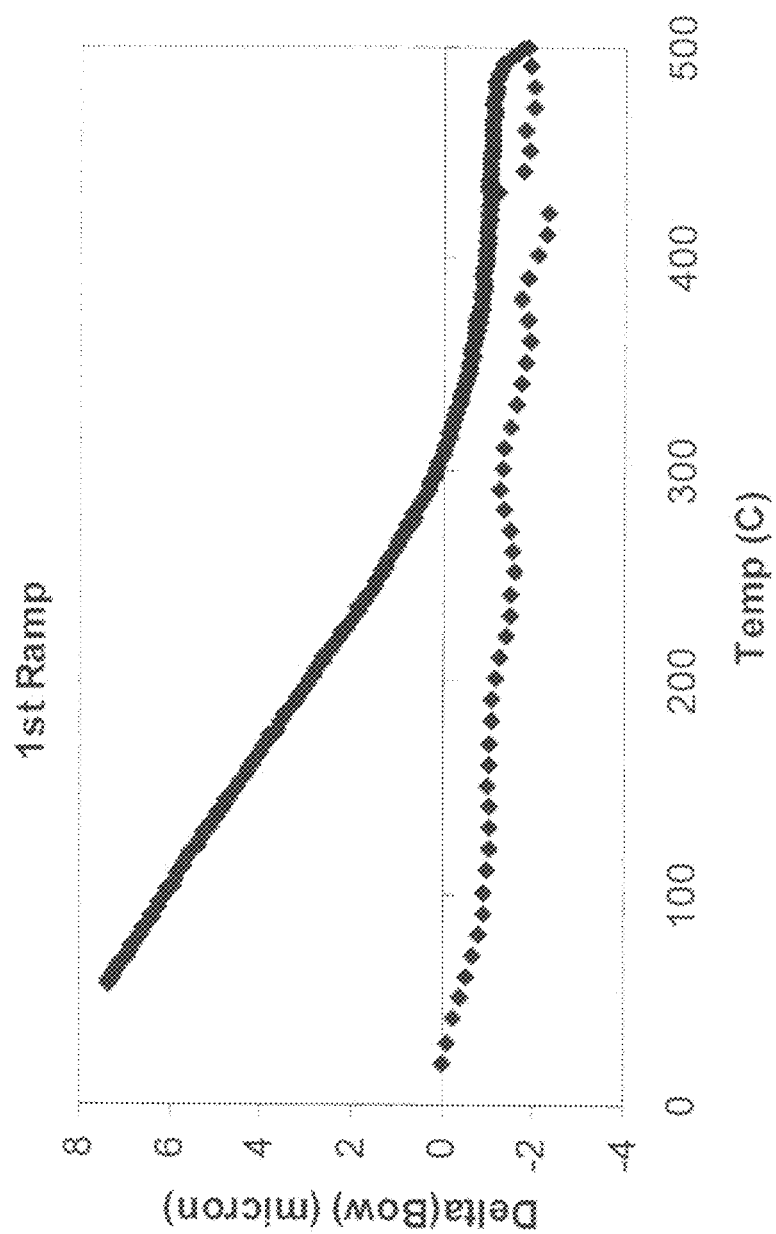
FIG. 6a is a graphical representation of in-situ stress measurements of a substrate having a thick Ni film (300 nanometers) that has been electrodeposited over a top surface of silicon from a Ni plating solution comprising Nickel sulfamate and boric acid. The stress measurements were taken during the first of two times that the temperature was ramped from room temperature to 500 degrees Centigrade.
Figure 6B:
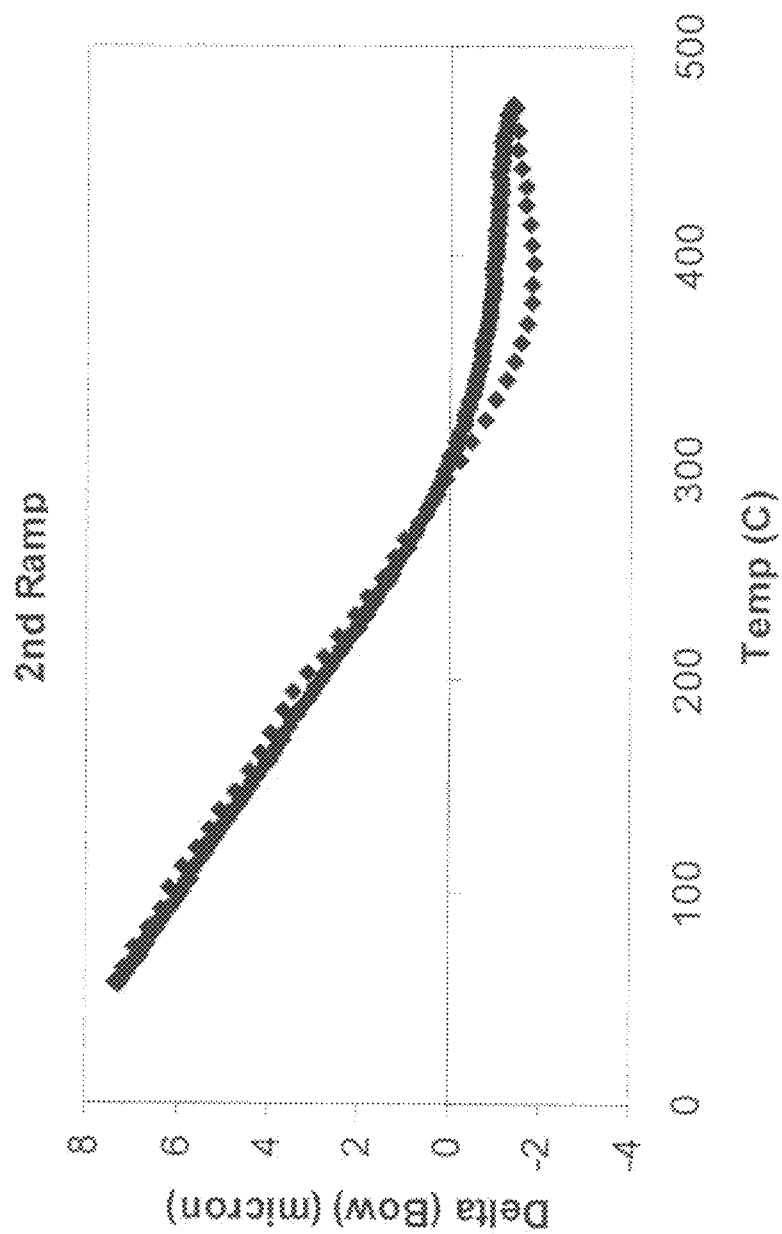
FIG. 6b is a graphical representation of in-situ stress measurements of a substrate having a thick Ni film (300 nanometers) that has been electrodeposited over a top surface of silicon from a Ni plating solution comprising Nickel sulfamate and boric acid. The stress measurements were taken during the second of two times that the temperature was ramped from room temperature to 500 degrees Centigrade.
Figure 7:
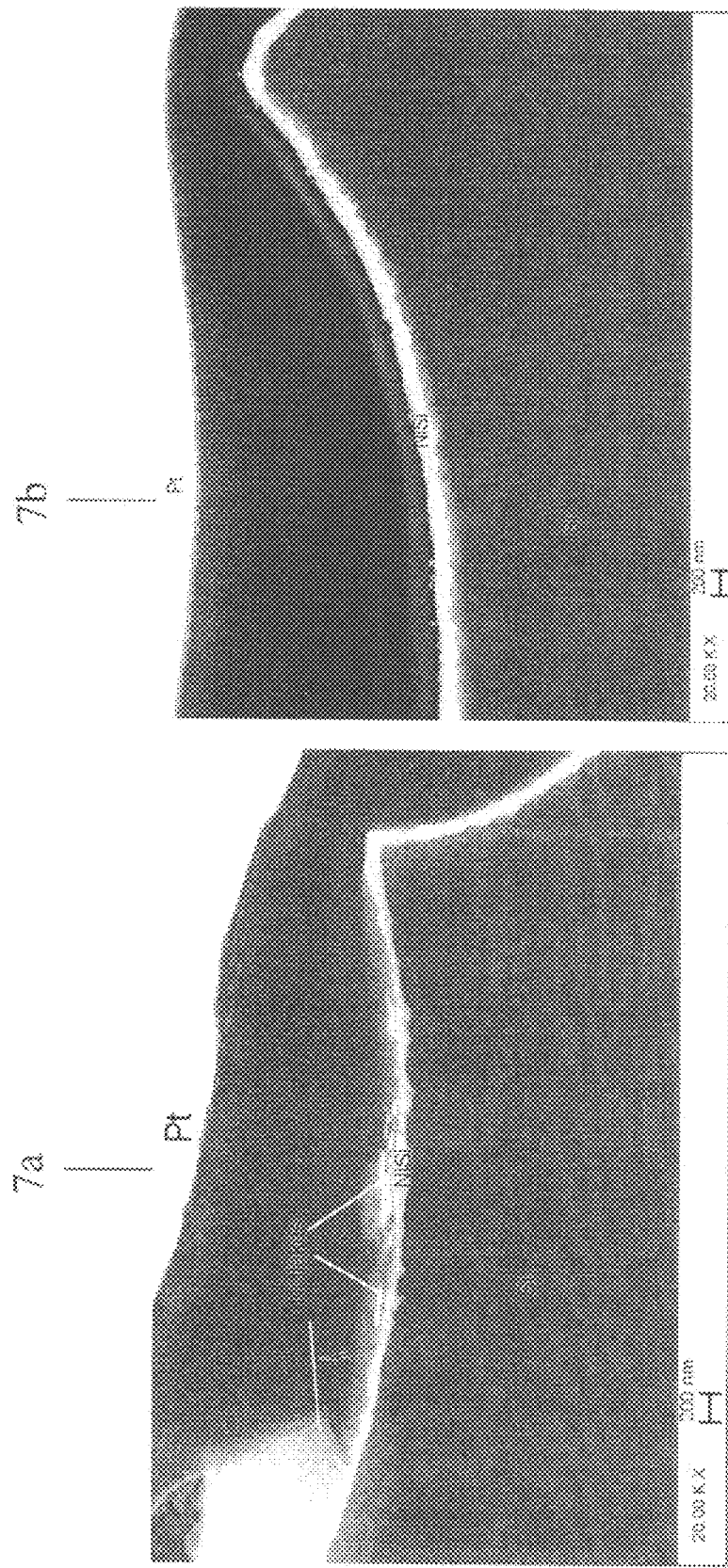
FIG. 7 shows Focused Ion Beam (FIB) cross-sectional views of two samples.

A thick Ni film (having a thickness of approximately 200 nanometers) was evaporated from a high vacuum chamber on to a clean silicon substrate. The substrate was placed in an oven with in situ stress measurement capabilities wherein laser reflection was used to measure the bow change of the substrate to detect a change in stress. To anneal the Ni film, the temperature of the oven was then ramped from about room temperature to about 500 degrees Celsius twice. The bowing of the substrate was measured in-situ during the temperature ramping. FIGS. 4a and 4b show the change of the substrate bow during the first and second temperature ramps, respectively. After the first annealing, silicide formation could be seen clearly. After the second annealing, it was obvious that the Ni film was completely converted to Ni silicide. oven was then ramped from about room temperature to about 500 degrees Celsius twice. The bowing of the substrate was measured in-situ during the temperature ramping. FIGS. 6a and 6b show the change of the substrate bow during the first and second temperature ramps, respectively. The curves are very similar to FIGS. 4a and 4b. After annealing, the whole Ni film layer was converted to Ni silicide. No delamination of the Ni film from the substrate occurred. Therefore, the Ni film deposited from the plating bath comprising Ni sulfamate salts reacts with silicon in the same way the Ni film deposited in a physical vapor deposition process does. Therefore, it was concluded that Ni silicide could be formed in a controllable manner using the Ni sulfamate plating solution.

Still other objects and advantages of the present disclosure will become readily apparent by those skilled in the art from the preceding detailed description, wherein it is shown and described preferred embodiments, simply by way of illustration of the best mode contemplated. As will be realized the disclosure is capable of other and different embodiments, and its several details are capable of modifications in various obvious respects, without departing from the disclosure. Accordingly, the description is to be regarded as illustrative in nature and not as restrictive.

The term "comprising" (and its grammatical variations) as used herein is used in the inclusive sense of "having" or "including" and not in the exclusive sense of "consisting only of." The term "consisting essentially of" as used herein is intended to refer to including that which is explicitly recited along with what does not materially affect the basic and novel characteristics of that recited or specified. The terms "a" and "the" as used herein are understood to encompass the plural as well as the singular.

COMPARATIVE EXAMPLE 2

Figure 5A:
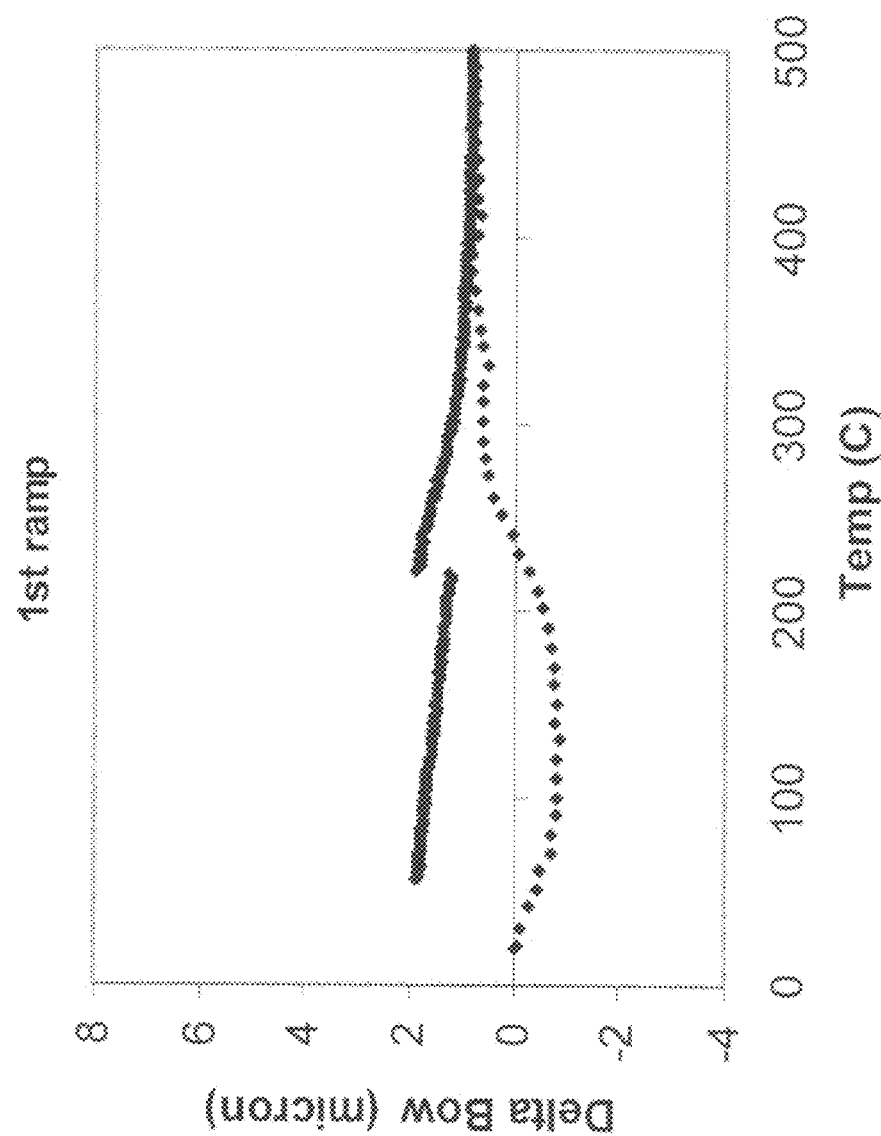
FIG. 5a is a graphical representation of in-situ stress measurements of a substrate having a thick Ni film (300 nanometers) that has been electrodeposited over a top surface of silicon from a common Watts Ni plating solution comprising Nickel chloride and Nickel sulfate salts, and saccharin. The stress measurements were taken during the first of two times that the temperature was ramped from room temperature to 500 degrees Centigrade.
Figure 5B:
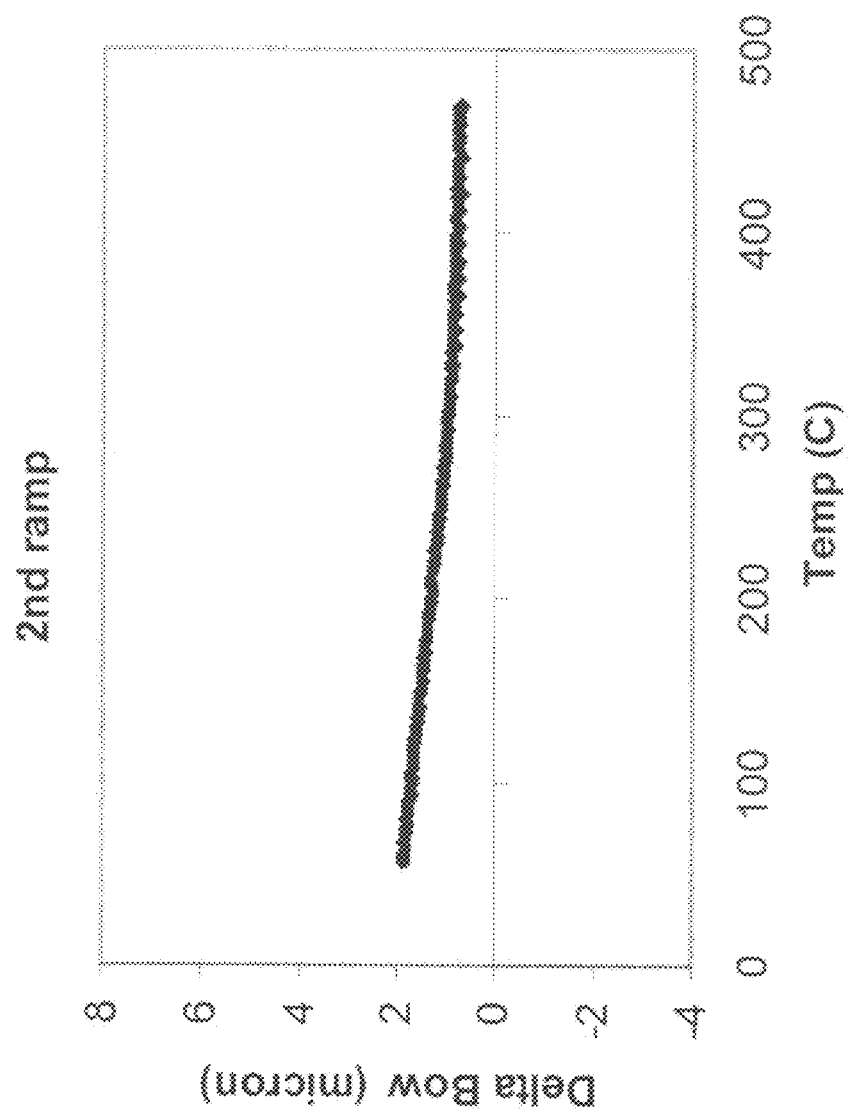
FIG. 5b is a graphical representation of in-situ stress measurements of a substrate having a thick Ni film (300 nanometers) that has been electrodeposited over a top surface of silicon from a common Watts Ni plating solution comprising Nickel chloride and Nickel sulfate salts, and saccharin. The stress measurements were taken during the second of two times that the temperature was ramped from room temperature to 500 degrees Centigrade.

A thick Ni film (having a thickness of approximately 300 nanometers) was electrodeposited on to a clean silicon substrate. A common Ni plating solution comprising Nickel chloride, Nickel sulfate salts, and saccharin was used. The substrate was placed in an oven with in situ stress measurement capabilities wherein laser reflection was used to measure the bow change of the substrate to detect a change in stress. To anneal the Ni film, the temperature of the oven was then ramped from about room temperature to about 500 degrees Celsius twice. The bowing of the substrate was measured in-situ during the temperature ramping. FIGS. 5a and 5b show the change of the substrate bow during the first and second temperature ramps, respectively. After the first annealing, it was clear that not much silicide formation had occurred as can be seen from the lack of silicide formation peaks during ramping up. During the ramping down, there was a sudden drop in bow change indicating delamination of the Ni film. The Delta Bow remained very small, indicating that very little silicide had formed, during the second ramping. In addition, the curve traces back to its original state which indicated that no additional silicide formed even though unreacted Ni remained. The Ni film here behaved very differently than Ni films deposited via a physical vapor deposition (PVD) method. Indeed, the delamination of the Ni film resulted in an uncontrollable silicide formation.

COMPARATIVE EXAMPLE 3

A thick Ni film (having a thickness of approximately 300 nanometers) was electrodeposited on to a clean silicon substrate. The Ni film was electrodeposited from a Ni plating bath comprising Ni sulfamate and boric acid. The substrate was placed in an oven with in situ stress measurement capabilities wherein laser reflection was used to measure the bow change of the substrate to detect a change in stress. To anneal the Ni film, the temperature of the

What is claimed is:

1. A method of forming a silicide, having a controllable, uniform thickness, on a silicon substrate comprising:
   (A) electrodepositing a Ni film on a silicon substrate, wherein the Ni film is electrodeposited from a saccharin-free plating bath comprising Ni sulfamate and boric acid; and
   (B) forming a metallic silicide pattern by annealing the Ni film on the silicon substrate.

2. The method according to claim 1, wherein the annealing occurs at a temperature of about 250 degrees Celsius to about 400 degrees Celsius, and for a time of about 5 seconds to about 600 seconds.

3. The method according to claim 2, wherein the plating bath is maintained at a pH of about 2 to about 5, and a temperature of about 0 degrees Celsius to about 60 degrees Celsius, and a concentration of Ni sulfamate in plating bath is about 0.01 M to about 5 M.

4. The method according to claim 3, wherein the concentration of Ni sulfamate is about 0.1 M to about 2 M.

5. The method according to claim 1, wherein the Ni film is about 20 nanometers to about 500 nanometers thick.

6. The method according to claim 1, wherein the annealing further comprises monitoring the formation of the metallic silicide pattern, wherein monitoring comprises:
   (A) placing the silicon substrate in an oven having in situ stress measurement capability;
   (B) ramping a temperature in the oven from about room temperature to a higher temperature; and
   (C) measuring a bowing of the silicon substrate in situ during the ramping process.

7. The method according to claim 6, wherein the higher temperature is about 500 degrees Celsius, and the temperature is ramped from about room temperature to about 500 degrees Celsius at least two times.

8. A CMOS device, a micro-electro-mechanical (MEM) device, or a photovoltaic cell comprising a silicide formed by the method according claim 1.

9. A method of forming a silicide, having a controllable, uniform thickness, on a silicon substrate comprising:
   (A) texturing a front side of a doped silicon substrate;
   (B) forming a diode junction by diffusing a dopant opposite to a dopant of the doped silicon substrate on the front side of the silicon substrate;
   (C) depositing an anti-reflective coating on the oppositely-doped front side of the silicon substrate;
   (D) depositing a metallic layer on a back side of the silicon substrate and heating the metallic layer to form a back surface field;
   (E) patterning a mask over the anti-reflection coating;
   (F) etching out exposed regions of the anti-reflection coating;
   (G) electrodepositing a Ni film from a saccharin-free plating bath comprising Ni sulfamate and boric acid on the etched regions of the front side of the silicon substrate;
   (H) removing the mask:
   (I) annealing the Ni film to form a Ni silicide pattern on the from side of the silicon substrate; and
   (J) depositing a conductor layer on the Ni silicide pattern.

10. The method according to claim 9, wherein the annealing occurs at a temperature of about 250 degrees Celsius to about 400 degrees Celsius.

11. The method according to claim 10, wherein the Ni film is about 20 nanometers to about 500 nanometers thick.

12. The method according to claim 11, wherein the plating bath is maintained at a pH of about 2 to about 5, and a temperature of about 0 degrees Celsius to about 60 degrees Celsius, and a concentration of Ni sulfamate in the plating bath is about 0.01 M to about 5 M.

13. The method according to claim 12, wherein the concentration of Ni sulfamate is about 0.1 M to about 2 M.

14. The method according to claim 9, wherein the silicon substrate is doped with phosphorous, and annealing of the Ni film is done at about 300 degrees Celsius for approximately 10 minutes.

15. The method according to claim 9, wherein the conductor layer is deposited using an electrode position process.

16. The method according to claim 9, wherein the conductor layer comprises Cu, Ag, Au, Ni, Al, Co, Sn, Zn, or an alloy thereof.

17. The method according to claim 9, wherein the annealing further comprises monitoring the formation of the metallic silicide pattern, and wherein monitoring comprises:
   (A) placing the silicon substrate in an oven having in situ stress measurement capability;
   (B) ramping a temperature in the oven from about room temperature to a higher temperature; and
   (C) measuring a bowing of the silicon substrate in situ during the ramping process.

18. The method according to claim 17, wherein the higher temperature is about 500 degrees Celsius, and the temperature is ramped from about room temperature to about 500 degrees Celsius at least two times.

19. The method according to claim 9, further comprising controlling a thickness of the metallic silicide pattern by adjusting an annealing temperature and a length of time the front side metal film is annealed.

20. A CMOS device, a micro-electro-mechanical (MEM) device, or a photovoltaic cell comprising a silicide formed by the method according to claim 9.

* * * * *